(12) United States Patent
Han

(10) Patent No.: US 9,605,797 B2
(45) Date of Patent: Mar. 28, 2017

(54) SUBSTRATE LOADING DEVICE

(71) Applicant: Samsung Display Co., Ltd., Yongin, Gyeonggi-Do (KR)

(72) Inventor: Gyeong-Hee Han, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 287 days.

(21) Appl. No.: 14/154,980

(22) Filed: Jan. 14, 2014

(65) Prior Publication Data

US 2014/0231370 A1 Aug. 21, 2014

(30) Foreign Application Priority Data

Feb. 19, 2013 (KR) ........................ 10-2013-0017471

(51) Int. Cl.
*F16M 13/00* (2006.01)
*H01L 21/673* (2006.01)

(52) U.S. Cl.
CPC ......... *F16M 13/00* (2013.01); *H01L 21/6734* (2013.01); *H01L 21/67373* (2013.01); *H01L 21/67383* (2013.01)

(58) Field of Classification Search
CPC ... F16M 13/00; H01L 21/673; H01L 21/6734; H01L 21/67309; H01L 21/67373; H01L 21/67383; H01J 9/46; B65G 49/062; Y10S 206/832

USPC .......................................................... 211/41.1
See application file for complete search history.

(56) References Cited

U.S. PATENT DOCUMENTS

| | | | | |
|---|---|---|---|---|
| 3,599,234 A | * | 8/1971 | Andreini et al. ............. | 361/802 |
| 6,186,344 B1 | * | 2/2001 | Park et al. .................... | 211/41.1 |
| 7,188,736 B2 | * | 3/2007 | Choi ........................... | 211/41.18 |
| 7,978,279 B2 | * | 7/2011 | Chung .......................... | 349/58 |
| 2004/0164035 A1 | * | 8/2004 | Jang .......................... | 211/41.14 |
| 2012/0021552 A1 | * | 1/2012 | Alexander et al. ............ | 438/57 |
| 2012/0258414 A1 | * | 10/2012 | Matsuura et al. ................ | 432/5 |

FOREIGN PATENT DOCUMENTS

KR 1020020014543 A 9/2003
KR 1020080062258 A 7/2008

* cited by examiner

*Primary Examiner* — Korie H Chan
(74) *Attorney, Agent, or Firm* — Robert E. Bushnell, Esq.

(57) ABSTRACT

A substrate loading device including a frame part forming a loading space in which a plurality of substrates are loaded, and having an inlet surface in which the substrates are inserted, and a rear surface opposite to the inlet surface, a main support protruding from the rear surface of the frame part to support a rear side of the loaded substrates and a sub support mounted at the inlet surface of the frame part and protruding from the inlet surface to support a front and opposite side of the loaded substrates.

20 Claims, 4 Drawing Sheets

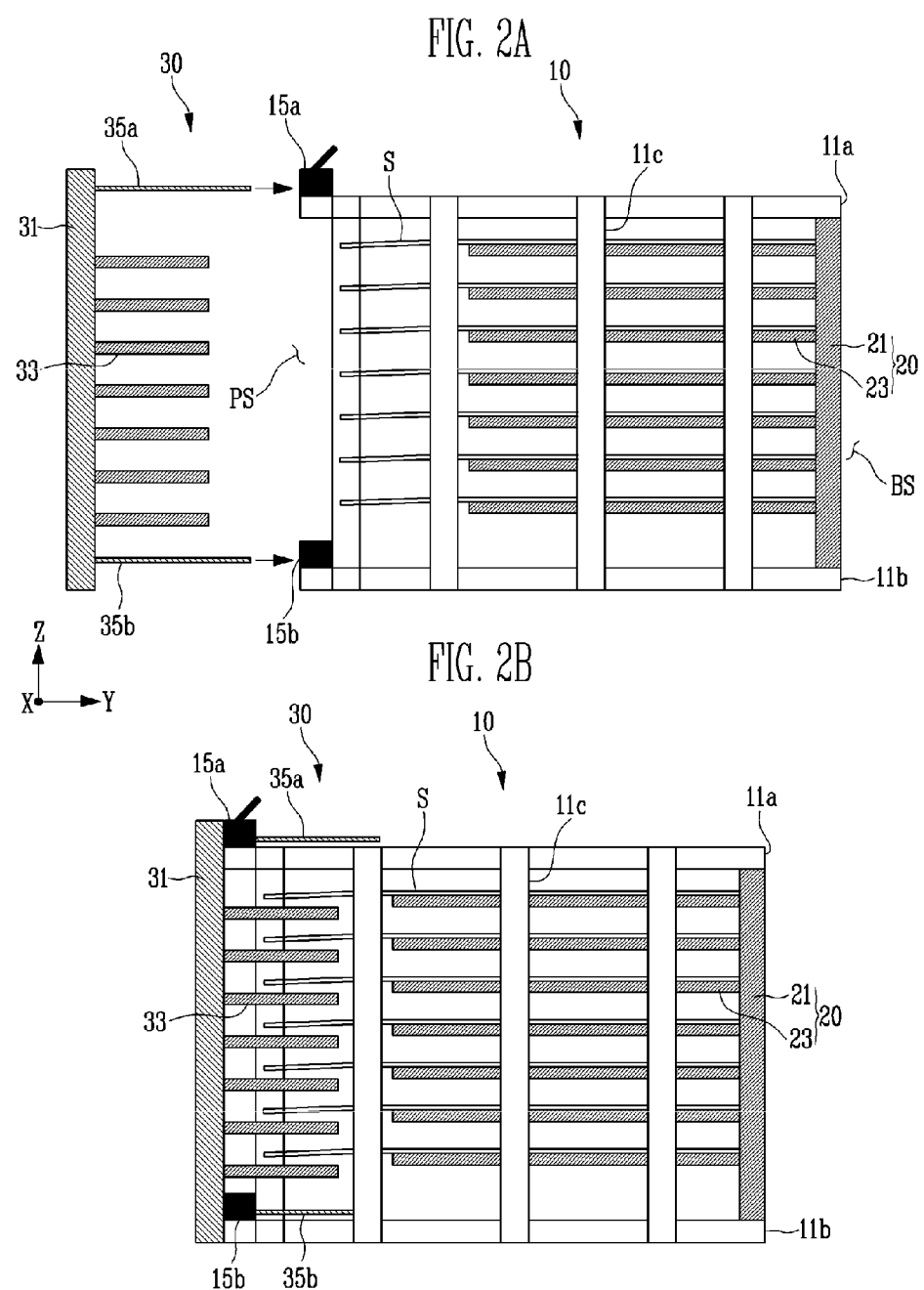

SUBSTRATE LOADING DEVICE

CLAIM OF PRIORITY

This application makes reference to, incorporates the same herein, and claims all benefits accruing under 35 U.S.C. §119 from an application earlier filed in the Korean Intellectual Property Office filed on Feb. 19, 2013 and there duly assigned Serial No. 10-2013-0017471.

BACKGROUND OF THE INVENTION

Field of the Invention

The present invention relates to a substrate loading device that loads a plurality of substrates.

Description of the Related Art

As a detailed example of a flat display device, there are a liquid crystal display device (LCD), a plasma display panel device (PDP), a field emission display device (FED), an organic light emitting diode (OLED), and the like, Here, each of the flat display devices essentially has flat transparent substrates that face and are attached to each other and have a fluorescent and/or polarization material layer there between.

In a process of manufacturing a flat display device, a large number of processes are included, such as a cleaning process, an attaching process, a cutting process, deposition process to deposit a thin film made of predetermined material on a substrate, a photolithography process to expose a selected portion of the thin film, and an etching process to implement a desired thin film pattern by removing the exposed portion of the thin film.

Meanwhile, substrates for manufacturing a flat display device may be kept in a substrate loading device such as a cassette to temporarily keep, transport or move into each process. Particularly, the substrate loading device may be placed in a thermal processing device, such as a hardening furnace in a state in which the substrates are loaded. In view of the process characteristics of the hardening, since much time is consumed, the substrate loading device must be configured to process a plurality of semiconductor substrates at a time in order to provide for sufficient throughput for a manufacturing line environment.

However, in the case in which the substrate is heated for a long time, the substrate may bend, warp and/or sag. When such bending, warping and sagging of the substrates occur, defects can be generated.

In accordance with the recent trend toward thinness and increased surface area of the substrate, the warpage problem of the substrate is further intensified, thereby causing deterioration of productivity, yield and reliability of in the manufacturing process.

SUMMARY OF THE INVENTION

An object of the present invention is to provide a substrate loading device capable of securing reliability, yield, throughput and productivity of the manufacturing process of a display by minimizing the warpage problem of the substrate when substrates are subjected to heat for a long period of time.

According to an aspect of the present invention, there is provided a substrate loading device, including a frame part forming a loading space in which a plurality of substrates are loaded, and having an inlet surface in which the substrates are inserted, and a rear surface opposite to the inlet surface, a main support protruding from the rear surface of the frame part to support a rear side of the loaded substrates and a sub support mounted at the inlet surface of the frame part and protruding from the inlet surface to support a front and opposite side of the loaded substrates.

The main support may include a main support bar traversing the rear surface of the frame part and a plurality of rear guides arranged at predetermined intervals on the main support bar to support rear sides of a lower surface of the loaded substrates. The frame part may include an upper frame arranged at an upper portion, a lower frame arranged at a lower portion and right and left side frames forming the loading space together with the upper and lower frames. The frame part may also include a plurality of side guides protruding from the right and left side frames and arranged at predetermined intervals along side portions of the lower surface of the loaded substrates.

The sub support may include a sub support bar traversing the inlet surface of the frame part and a plurality of front guides arranged at predetermined intervals from each other on the sub support bar to support front sides of a lower surface of the loaded substrates. The sub support may also include an upper holder and a lower holder arranged at upper and lower portions respectively of the sub support bar and mounted on the frame part, the frame part may also include an upper coupling block and a lower coupling block provided at the upper and lower portions respectively of the inlet surface to receive and couple with the upper holder and the lower holder respectively. The holders and the coupling blocks may have a detachable structure. The upper coupling block may include a lifting device to lift the upper holder vertically to adjust a height of the front guides. The lifting device may include a lifting body coupled to the upper coupling block by a screw to lift the upper holder vertically by rotation. The lifting body may include a fixing body, the upper holder being insertedly fixed to the fixing body and a rotation body, first end of the rotation body may be independently rotatably coupled to the fixing body. The lifting device may also include a lever bent from an second and opposite end of the rotation body to form a user's handle. The lifting device may also include a driving motor to rotate the rotation body and a controller to control the driving motor. The lower coupling block may include an elastic member to provide elasticity to the lower holder in a vertical direction.

The sub support may include a first sub support spaced apart from a second sub support, each of the first and second sub supports including a sub support bar traversing the inlet surface of the frame part; and a plurality of front guides arranged at predetermined intervals from each other on the sub support bar to support front sides of a lower surface of the loaded substrates, the first sub support bar being arranged on an opposite side of a center line of the substrate loading device than the second sub support bar. The first sub support bar may be arranged within a left half of the substrate loading device and the second sub support bar may be arranged within a right half of the substrate loading device, each of the first and second sub supports may also include an upper holder and a lower holder arranged at upper and lower portions respectively of the sub support bar and mounted on the frame part.

The frame part may include a plurality of front guides protruding from the inlet surface of the frame part, a plurality of rear guides protruding from a rear surface of the frame part and a plurality of right and left guides protruding from right and left surfaces of the frame part, each of the front, rear, right and left guides may support a lower surface of a front portion, rear portion and right and left portions respectively of the loaded substrates to prevent the loaded substrates from sagging upon being heated. Corresponding ones of the left guides may be arranged on a same level, supporting a same one of the loaded substrates, and extending towards tips of corresponding ones of the right guides, while corresponding ones of the front guides may be arranged on a same level, supporting a same one of the loaded substrates and extending towards tips of corresponding ones of the rear guides.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2A to 2C are cross-sectional views describing a method for mounting of the sub support for the arrangement of FIG. 1A.

DETAILED DESCRIPTION OF THE INVENTION

Figure 1A:
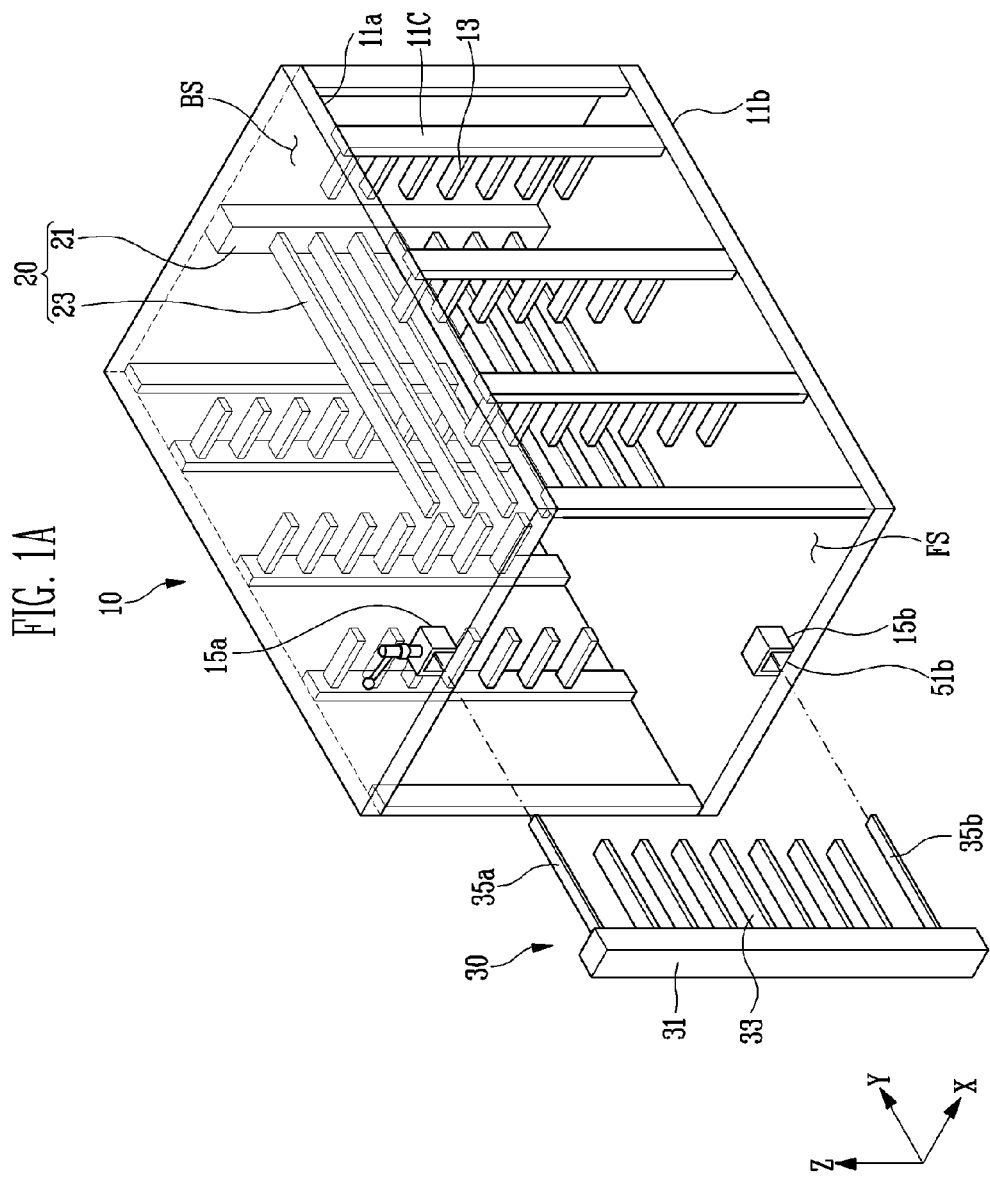
FIG. 1A is a schematic view schematically showing an example of a substrate loading device according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, exemplary embodiments of the present invention will be described in detail with reference to the accompanying drawings.

Figure 1B:
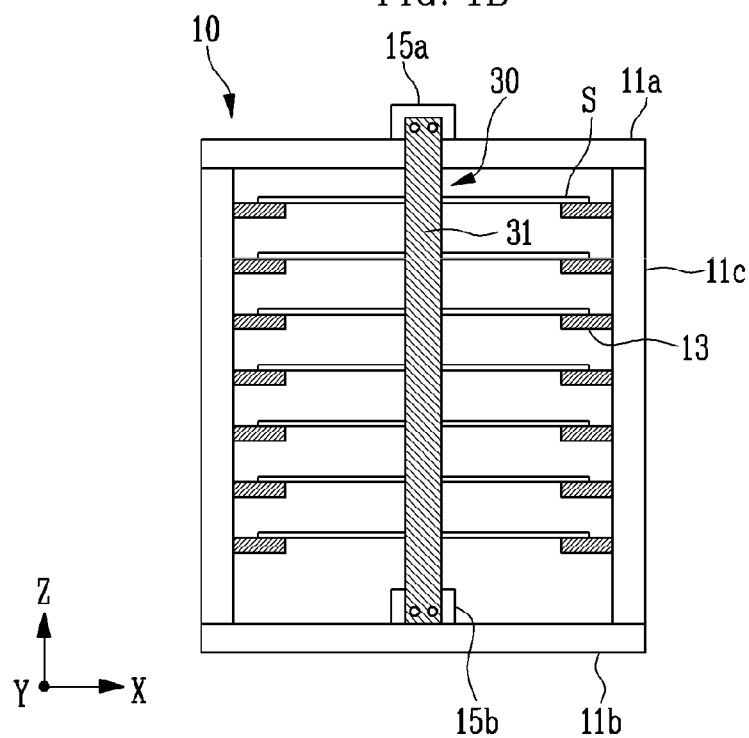
FIG. 1B is a front view of the substrate loading device of FIG. 1A showing the front of substrate loading device having loaded substrates therein.
Figure 1C:
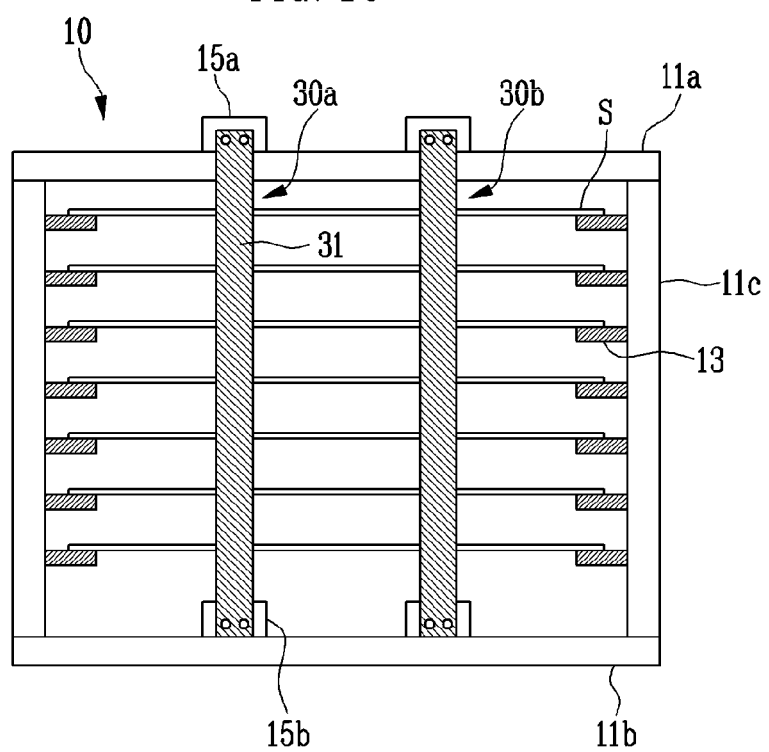
FIG. 1C is a front view showing another embodiment of the substrate loading device of FIG. 1A where additional sub supports are included.

Turning now to FIGS. 1A to 1C, FIG. 1A is a schematic view schematically showing an example of a substrate loading device, FIG. 1B is a front view of the substrate loading device of FIG. 1A with substrates arranged therein, and FIG. 1C is a front view showing another embodiment where a plurality of sub supports are provided. The substrate loading device may be transferred, kept, or arranged within a substrate processing device in a state in which a plurality of substrates are loaded. Directional coordinate axes are illustrated in FIG. 1A, with a Z direction being perpendicular to the surface.

Referring now to FIGS. 1A and 1B, the substrate loading device includes a frame part 10 forming a loading space into which a plurality of substrates S are loaded, and having an inlet surface FS in which the substrates S are inserted, and a rear surface BS opposite to the inlet surface FS. The substrate loading device also includes a main support 20 protruding from the rear surface BS of the frame part 10 and then supporting a rear side of the loaded substrates S, and a sub support 30 mounted at an inlet surface FS of the frame part 10, protruding from the inlet surface FS and supporting the front and opposite side of the loaded substrates S.

The frame part 10 has a box shape in which at least one surface (inlet surface FS) is opened and a loading space including the plurality of substrates loaded therein. Other surfaces with the exception of the inlet surface FS may be covered by a flat plate, and be a frame structure having opened area.

Specifically, the frame part 10 may be configured to include an upper frame 11a disposed at a upper portion, a lower frame 11b disposed at a lower portion, and side frames 11c forming the loading space together with the upper and lower frames 11a and 11b. In addition, the frame part 10 may further include a plurality of side guides 13 protruding from the side frames 11c and disposed at a predetermined interval along the sides of the substrates S. Here, the plurality of the side frames 11c have a bar shape and may be arranged vertically (in the Z direction) to the right and the left with respect to the inlet surface FS. The plurality of side guides 13 horizontally protrude in a direction (X direction) and approach each other at an inner surface of each side frame 11c to support both side of the substrates S. The plurality of side guides 13 positioned on the same plane (XY plane) is defined as a single layer, and the substrates S are loaded with each layer. The shape of the frame part 10 and the loaded structure of the substrates S are not limited thereto, and may have various modified examples.

The main support 20 may be configured to include a main support bar 21 traversing in a vertical direction (the Z direction) the rear surface BS of the frame part 10, and rear surface guides 23 which are disposed at a predetermined interval on the main support bar 21 and supporting a rear portion of lower surfaces of the substrates S. More specifically, the main support bar 21 may have a bar shape, and may be vertically disposed traversing a central portion of the rear surface BS. The rear surface guides 23 are protruded from an inner surface of the main support bar 21 towards the inlet surface FS to support central portions of the substrates S. The main support bar 21 and the rear guides 23 are coupled by coupling members (not shown), such as bolt/nut, joint and/or clamp or a screw thread and a flange structure to thereby secure a mechanical coupling strength.

The sub support 30 may be configured to include a sub support bar 31 traversing in the vertical direction across inlet surface FS of the frame part 10, front guides 33 which are disposed at a predetermined interval on the sub support bar 31 and supporting a front portion of lower surfaces of the substrates S, and holders 35a and 35b each provided on the upper and lower portions of the sub support bar 31 and mounted on the frame part 10. More specifically, the sub support bar 31 may have a bar shape, and may be vertically mounted traversing a central portion of the inlet surface FS.

The front guides 33 are protruded from an inner surface of the sub support bar 31 and extend towards the rear surface BS to support a central portion of the substrates S. That is, the main support bar 21 and the sub support bar 31 are formed in parallel with each other having the substrate disposed therebetween. In addition, the rear guides 23 and front guides 33 horizontally protrude in the direction (a Y direction) facing each other to support the central portion of the loaded substrates S. In this case, the rear guides 23 may have a length longer than that of the front guides 33. The sub support bar 31 and the front guides 33 are coupled by the coupling members (not shown) such as bolt/nut, joint and/or clamp or the screw thread and the flange structure between the coupling members to each other to thereby secure the mechanical coupling strength.

The holders 35a and 35b protrude from the sub support bar 31 similar to the front guides 33, but unlike front guides 33, holders 35a and 35b serve to mount to frame part 10. The holders may be divided into an upper holder 35a disposed at the upper portion of the sub support bar 31 and a lower holder 35b disposed at the lower portion thereof. The frame part 10 may further include coupling blocks 15a and 15b which are provided on the upper and lower portions of the inlet surface FS, respectively, and where holders 35a and 35b are inserted into coupling blocks 15a and 15b respectively. Here, the holders 35a and 35b and the coupling blocks 15a and 15b have a detachable structure.

Meanwhile, referring to FIG. 1C, as another exemplary embodiment, the sub support 30 may include a plurality of sub supports 30a and 30b to increase a bearing capacity and a range of the substrates according to a size and a thickness of the substrates. Although not illustrated, the main support 20 may also include a plurality of main support bars.

Figure 2C:
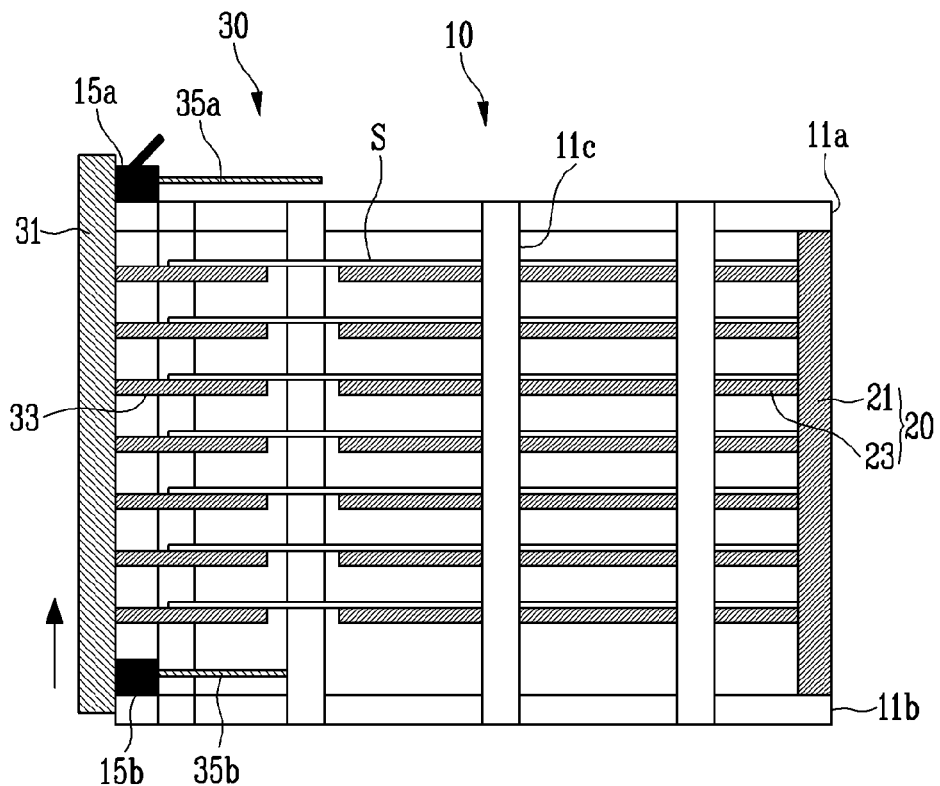
Figure 3:
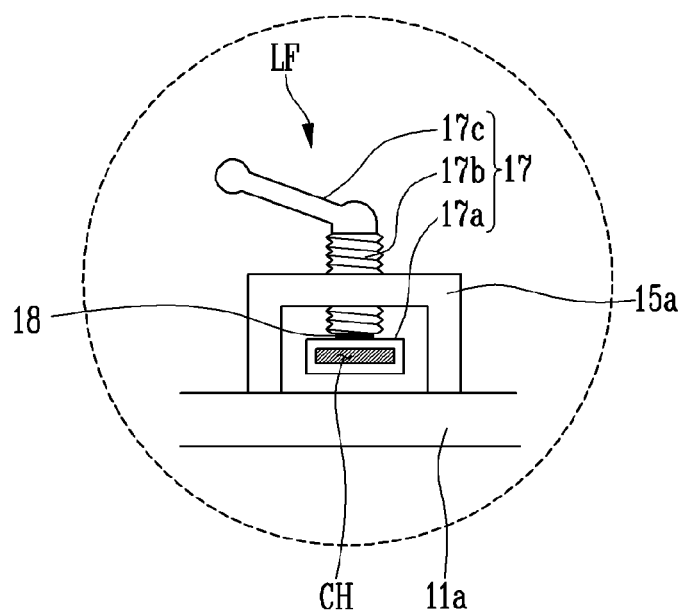
FIG. 3 is a partially enlarged view schematically showing an example of a lifting device.

Turning now to FIGS. 2A to 3, FIGS. 2A to 2C are cross-sectional views describing a method for mounting the sub support and FIG. 3 is a partially enlarged view schematically showing an example of a lifting device. Description of like items as previously described will be minimized.

Referring to FIGS. 2A to 2C, firstly, a plurality of substrates S are loaded into the loading space in the frame part 10. For example, a loading operation of the substrates may be performed by a device for loading/unloading with substrates (not shown), such as a robotic arm. The sides of the loaded substrates S are supported by the side guides 13 protruded from the side frames 11c, and the rear surface BS and the central portion of the loaded substrates S are supported by the rear guides 23 protruded from the main support bar 21.

However, in this state, since there is no configuration supporting the inlet surface FS of the substrates S, warpage of the substrates may occur. Particularly, in the case in which each substrate S has a large size or may be thin in thickness, the warpage of the substrate may be significant and lead to defects. Therefore, the present invention includes at least one sub support 30 mounted at the inlet surface FS of the substrate loading device, and a lifting device to lift the sub support 30. Therefore, the substrate loading device may be ensured reliability during processing by more stably supporting the substrates S and minimizing the warpage problem of the substrates.

More specifically, the holders 35a and 35b of the sub support 30 are inserted into and coupled to the coupling blocks 15a and 15b respectively. In this case, in order to prevent drooping of the substrates S, the front guides 33 should be mounted so as to be spaced apart from the lower surface of the substrates S at the predetermined interval. That is, the front guides 33 and the rear guides 23 are disposed to be alternated with each other.

The holders 35a and 35b and the coupling blocks 15a and 15b are coupled together by the coupling members (not shown), such as a screw thread or a flange structure to thereby secure the mechanical coupling strength. In addition, the coupling structure must have a detachable structure.

Then, the sub support 30 can move in the vertical direction (Z direction) having the predetermined interval using the lifting device. That is, the sub support 30 is lifted up so that the front guides 33 and rear guides 23 are level with each other.

After the predetermined process is completed, in the case in which the substrates S are to be removed from the substrate loading device, a reverse process occurs. First, the sub support 30 is lifted down in the vertical direction, then releasing, detaching and separating the sub support 30 from the housing, and finally removal of the substrates by a robotic arm or the like from the loading device.

Referring now to FIG. 3, at least one of the coupling blocks 15a and 15b, for example, the upper coupling block 15a, may include a lifting device LF to adjust a height of the front guides 33 by lifting the upper holder 35a vertically. The lifting device LF may be configured to include a lifting body 17 coupled to the upper coupling block 15a by a screw coupling technique to lift the holder 35a vertically by the rotation. The lifting body includes a fixing body 17a into which the upper holder 35a is inserted and fixed thereto, a rotation body 17b having one end independently and rotatably coupled to the fixing body 17a, and a lever 17c bended from the other end of the rotation body 17b to form a user's handle.

More specifically, the fixing body 17a has an opened coupling hole CH into which the upper holder 35a is inserted and arranged, and is mechanically coupled to the rotation body 17b. However, the fixing body 17a does not rotate according to the rotation body 17b due to a washer 18 provided between the fixing body 17a and the rotation body 17b.

The rotation body 17b has a screw shape having threads formed at an outer peripheral surface thereof, and penetrates and is inserted into one surface of upper coupling block 15a. The fixing body 17a is arranged at a lower end of the rotation body 17b, the lever 17c is arranged at a top end of the rotation body 17b.

In the case in which a user rotates the lever 17c, the rotation body 17b rotates along the screw threads and moves vertically together with the rotation of the lever 17c, causing the sub support 30 coupled to fixing body 17a to move vertically. In another exemplary embodiment, the lifting device may include a driving motor (not shown) rotating the rotation body 17, and a controller (not shown) controlling the driving motor, such that a precise and automated lifting function may be provided.

Meanwhile, the other one of the coupling blocks 15a and 15b, for example, the lower coupling block 15b, may include an elastic member 51b providing elasticity with respect to the coupled lower holder 35b in the vertical direction (Z direction) instead of having a separate lifting device due to the narrow space.

As set forth above, with the exemplary embodiment of the present invention, the substrate loading device mounts a separate substrate support at an inlet surface and includes a lifting device lifting the inlet substrate support, whereby reliability for process may be secured by stably supporting the substrate and minimizing warpage problem.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A substrate loading device, comprising:
    a frame part forming a loading space in which a plurality of substrates are loaded, and having an inlet surface in which the substrates are inserted, and a rear surface opposite to the inlet surface;
    a main support protruding from the rear surface of the frame part to support a rear side of the loaded substrates; and
    a sub support mounted at the inlet surface of the frame part and protruding from the inlet surface to support a front and opposite side of the loaded substrates, wherein the sub support is detachably attached to the frame part, and wherein the main support is not detachable from the frame part.

2. The substrate loading device of claim 1, the sub support comprising:
    a sub support bar vertically traversing the inlet surface of the frame part; and
    a plurality of front guides arranged at predetermined intervals from each other on the sub support bar to support front sides of a lower surface of the loaded substrates.

3. The substrate loading device of claim 2, wherein the sub support further includes an upper holder and a lower holder arranged at upper and lower portions respectively of the sub support bar and mounted on the frame part, the frame part further includes an upper coupling block and a lower coupling block provided at the upper and lower portions respectively of the inlet surface to receive and couple with the upper holder and the lower holder respectively.

4. The substrate loading device of claim 3, wherein the holders and the coupling blocks have a detachable structure.

5. The substrate loading device of claim 4, wherein the upper coupling block includes a lifting device to lift the upper holder vertically to adjust a height of the front guides.

6. The substrate loading device of claim 5, wherein the lifting, device includes a lifting body coupled to the upper coupling block by a screw to lift the upper holder vertically by rotation.

7. The substrate loading device of claim 6, wherein the lifting body comprises:
    a fixing body, the upper holder being insertedly fixed to the fixing body; and
    a rotation body, a first end of the rotation body being independently rotatably coupled to the fixing body.

8. The substrate loading device of claim 7, wherein the lifting device further comprises a lever bent from an second and opposite end of the rotation body to form a user's handle.

9. The substrate loading device of claim 7, wherein the lifting device further comprises:
    a driving motor to rotate the rotation body; and
    a controller to control the driving motor.

10. The substrate loading device of claim 4, wherein the lower coupling block includes an elastic member to provide elasticity to the lower holder in a vertical direction.

11. The substrate loading device of claim 1, wherein the main support comprises:
    a main support bar traversing the rear surface of the frame part; and
    a plurality of rear guides arranged at predetermined intervals on the main support bar to support rear sides of a lower surface of the loaded substrates.

12. The substrate loading device of claim 1, wherein the frame part comprises:
    an upper frame arranged at an upper portion;
    a lower frame arranged at a lower portion; and
    right and left side frames forming the loading space together with the upper and lower frames.

13. The substrate loading device of claim 12, wherein the frame part further includes a plurality of side guides protruding from the right and left side frames and arranged at predetermined intervals along side portions of the lower surface of the loaded substrates.

14. The substrate loading device of claim 1, wherein the sub support comprises a first sub support spaced apart from a second sub support, each of the first and second sub supports including:
    a sub support bar traversing the inlet surface of the frame part; and
    a plurality of front guides arranged at predetermined intervals from each other on the sub support bar to support front sides of a lower surface of the loaded substrates, the first sub support bar being arranged on an opposite side of a center line of the substrate loading device than the second sub support bar.

15. The substrate loading device of claim 14, the first sub support bar being arranged within a left half of the substrate loading device and the second sub support bar being arranged within a right half of the substrate loading device, wherein each of the first and second sub supports further includes an upper holder and a lower holder arranged at upper and lower portions respectively of the sub support bar and mounted on the frame part.

16. The substrate loading device of claim 1, wherein the substrate loading device further comprises:
    a plurality of front guides protruding from the inlet surface of the frame part;
    a plurality of rear guides protruding from a rear surface of the frame part; and
    a plurality of right and left guides protruding from right and left surfaces of the frame part, each of the front, rear, right and left guides supporting a lower surface of a front portion, rear portion and right and left portions respectively of the loaded substrates to prevent the loaded substrates from sagging upon being heated.

17. The substrate loading device of claim 1, wherein all surfaces of the frame part other than the inlet surface is covered by a flat plate.

18. A substrate loading device, comprising:
    a frame part forming a loading space in which a plurality of substrates are loaded, and having an inlet surface in which the substrates are inserted, and a rear surface opposite to the inlet surface;
    a main support protruding from the rear surface of the frame pan to support a rear side of the loaded substrates; and
    a sub support mounted at the inlet surface of the frame part and protruding from the inlet surface to support a front and opposite side of the loaded substrates, the sub support including a sub support bar traversing the inlet surface in a vertical direction, wherein all surfaces of the frame pan other than the inlet surface is covered by a flat plate, wherein the sub support corresponding to the inlet surface being an only portion of the substrate loading device that is detachable from the frame part, wherein the inlet surface being an only surface into which substrates can be loaded into and removed from the substrate loading device.

19. The substrate loading device of claim 18, the vertical direction being a direction that the substrates within the substrate loading device are stacked and spaced apart from one another, wherein the sub support further comprises a plurality of front guides, each being attached to the sub support bar and being arranged at predetermined intervals from each other on the sub support bar to support front sides of a lower surface of the loaded substrates.

20. The substrate loading device of claim 19, the main support comprises a main support bar extending parallel to the sub support bar and a plurality of rear guides attached to the main support bar to support a lower surface of the loaded substrates, the rear guides extending a greater distance than the front guides.

* * * * *